United States Patent [19]

Rinderle

[11] Patent Number: 4,689,498
[45] Date of Patent: Aug. 25, 1987

[54] SIGNAL INPUT CIRCUIT WITH CONSTANT OPERATING POWER

[75] Inventor: Heinz Rinderle, Heilbronn, Fed. Rep. of Germany

[73] Assignee: Telefunken electronic GmbH, Heilbronn, Fed. Rep. of Germany

[21] Appl. No.: 803,777

[22] Filed: Dec. 2, 1985

Related U.S. Application Data

[63] Continuation of Ser. No. 476,604, Mar. 18, 1983.

[30] Foreign Application Priority Data

Mar. 22, 1982 [DE] Fed. Rep. of Germany ....... 3210452

[51] Int. Cl.[4] .......................... H03G 3/18; H04B 1/28
[52] U.S. Cl. ..................................... 307/320; 307/256; 330/284; 330/145; 333/81 R
[58] Field of Search ................... 307/317 R, 320, 256; 333/81 R; 330/284, 145, 144

[56] References Cited

U.S. PATENT DOCUMENTS

| | | | |
|---|---|---|---|
| 3,652,959 | 3/1972 | Denny | 333/81 R |
| 3,663,900 | 5/1972 | Peterson | 333/81 R |
| 3,800,229 | 3/1974 | Backwinkel et al. | 325/381 |
| 3,813,602 | 5/1974 | Van Dijum et al. | 333/81 R |
| 3,846,724 | 11/1974 | Maier | 333/81 R |
| 4,019,160 | 4/1977 | Kam | 333/81 R |
| 4,216,445 | 8/1980 | Abajian | 333/81 R |
| 4,224,583 | 9/1980 | Larkin | 333/100 |
| 4,301,432 | 11/1981 | Carlson et al. | 333/164 |
| 4,369,414 | 1/1983 | Aoki et al. | 333/81 R |
| 4,378,536 | 3/1983 | Schwarzmann | 333/81 R |
| 4,494,076 | 1/1985 | Rinderle | 330/284 |

OTHER PUBLICATIONS

Turner, "Broadband P-I-N Attenuator Has Wide Input Dynamic Range", *Electronics*, vol. 46, No. 16, Aug. 8th, 1974 (pp. 106–107).
"PIN-Diode Attenuator", *Radio Communication*, Aug. 1974 (pp. 106–107).

*Primary Examiner*—Stanley D. Miller
*Assistant Examiner*—Richard Roseen
*Attorney, Agent, or Firm*—Spencer & Frank

[57] ABSTRACT

A signal input circuit composed of a control member, such as a PIN diode, for controllable attenuation of an input signal, and reactances for selection of the input signal, wherein the signal frequency current is regulated by the control member such that the operating power required by the input circuit remains constant to the greatest possible degree in spite of the regulation.

10 Claims, 6 Drawing Figures

SIGNAL INPUT CIRCUIT WITH CONSTANT OPERATING POWER

This application is a continuation of application Ser. No. 06/476,604, filed Mar. 18th, 1983.

BACKGROUND OF THE INVENTION

Amplifier circuits whose amplification is regulated are well known in receiver technology. In modern receiver circuits, amplification regulation of HF input circuits is effected, inter alia, by PIN diodes whose advantage lies in preventing the non-linear components of an input stage from being driven by strong signals, which would produce distortions, the PIN diodes not causing distortions themselves. Such amplification control components, i.e. PIN diodes, have the same effect, at high frequencies, as passive resistors whose resistance can be controlled by means of currents. For conventional PIN diodes, a current range of 0 to, for example, 10 mA is required for full regulation of the amplification. A special difficulty concerning the controlling of such regulating components arises when the controlling current has to be generated within an integrated circuit. In such a case, where the controlling current generation is effected in a conventional form, an additional electrical warming-up of the integrated circuit occurs, which, in turn, depends on the regulating state of the circuit being controlled, i.e. the level of current supplied to the PIN diode. This fact may, for instance, result in the other integrated functions of the rest of the circuit being negatively influenced by the warming-up which is dependent on the regulating state. The frequency of an oscillator which is also integrated, may, for example, change in dependence upon the regulating state.

SUMMARY OF THE INVENTION

It is an object of the invention to provide a circuit which permits generation of the controlling current for a control member without the disadvantages described hereinabove.

According to the invention, there is provided a signal input circuit with a control member for controllable attenuation of the input signal, and with reactances for selection of the input signal frequency, wherein the signal current is regulated by the control member such that the operating power required by the input circuit remains constant to the greatest possible extent even if the amplification of the input circuit is being varied by varying the controlling current.

BRIEF DESCRIPTION OF THE DRAWINGS

The invention will now be described in greater detail, by way of example, with reference to the drawings, in which.

DESCRIPTION OF THE PREFERRED EMBODIMENTS

Figure 1:
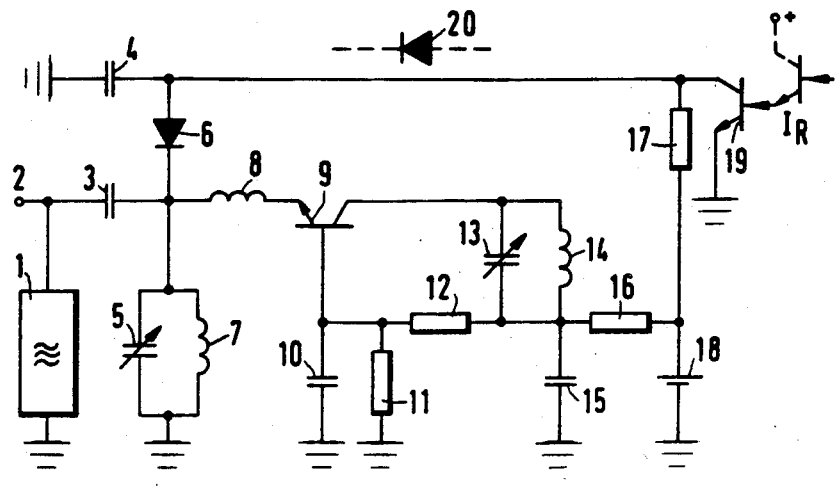
FIG. 1 shows the concept for the amplification control with a PIN diode as control member in the transverse branch of the input network, wtih separate generation of the maximum control current for the PIN diode, and with the PIN diode current being controlled by a shunt transistor.

The circuit shown in FIG. 1 comprises a HF input circuit with tunable, frequency selective input and output networks. The gain, i.e. degree of amplification, or attenuation, of the input circuit is controlled by means of a PIN diode 6 acting as a control member and functioning as a controllable resistor and located in a branch which is transverse, or parallel to, the reactances 5 and 7 constituting the frequency selecting components of the input network. Reactances 13 and 14 are the frequency selective components of the output network. The output signal from the illustrated circuit can be taken from the point of connection between reactances 13 and 14 and the collector of transistor 9. The controlling action is based on the fact that a portion of the signal current fed to the input network from signal source 1 is diverted via PIN diode 6 and blocking capacitor 4 in dependence upon the controlling current supplied to PIN diode 6 from voltage source 18 and resistor 17. In this form, the overall amplification of the arrangement decreases to the same extent as the controlling current passing through PIN diode 6 increases.

When a conventional PIN diode is used, for example, the controlling current supplied to the PIN diode must be variable from 0 to approximately 10 mA to obtain a full regulating range for the input circuit gain. The manner in which the controlling current is varied will be described below. If this controlling current were generated in an integrated circuit, the power loss produced by that current, and thus the temperature of the chip, would change. In this case, if, for example, a HF oscillator were provided on the same semiconductor chip, a change in the chip temperature could cause a substantial frequency change in the integrated HF oscillator, depending on the regulating state. This disadvantage is eliminated, in accordance with the invention, in the circuit shown in FIG. 1 in which the current which is to be fed to the PIN diode and which controls the effective gain of the input circuit is determined by a shunt transistor 19. The required maximum controlling current for the PIN diode (e.g. 10 Ma) is generated via the operating voltage source 18 in combination with the series resistor 17. The shunt transistor 19 constitutes a shunt resistor for the PIN diode. The current conducted by shunt transistor 19 is controlled in a manner known per se by controlling its base current $I_R$.

When the current through PIN diode 6 is controlled in this manner, in accordance with the invention, the change in power loss due to diode 6 is only about $\frac{1}{2} U_D I_{Dmax}$. Thus, a power loss change of merely 3 mW occurs with, e.g., a forward voltage of the PIN diode of $U_D \approx 0.6$ V and a maximum forward current of $I_{Dmax} \approx 10$ mA. Accordingly, the control arrangement can be integrated without any difficulty.

If, on the other hand, the current for the control member (PIN diode) were to be supplied via a controllable series resistor connected between the control member and the supply voltage, a change of 100 mW would occur, given an identical range (0 to 10 mA) for the current through diode 19, and a predetermined operating voltage of e.g. 10 V. It is, therefore, essential that the variable resistor (i.e. transistor 19) should not be connected in series with the control member 6, but parallel to the control member 6, as a shunt resistor. This type of control for the control member 6, permits the integration of the series resistor 17 since, with regulation, the power change in this resistor also remains slight.

As shown in FIG. 1, the controlling current for the base of the shunt transistor 19 may be amplified by means of an additional emitter follower amplifier, thus increasing control sensitivity, while reducing control power requirement. In critical cases, such as when a shunt transistor with increased collector emitter saturation voltage is used, it could happen that the PIN diode does not block sufficiently, with the result that the circuit does not reach full amplification. This can be prevented, e.g., by placing a standard diode 20 in the connecting line between the collector of the shunt transistor 19 and the PIN diode 6. Another component such as a field-effect transistor may be used instead of a bipolar transistor as shunt transistor 19. In the circuit of FIG. 1, resistors 11, 12 and 16 simply serve to set the operating points for output network 13, 14 and amplifying transistor 9.

Figure 2:
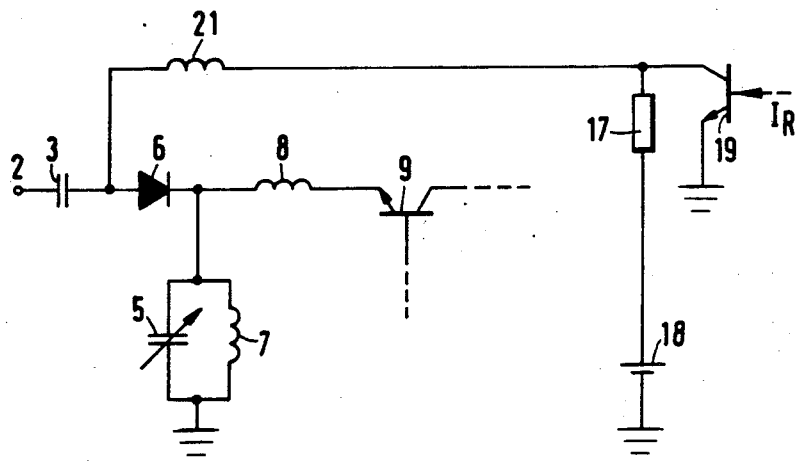
FIG. 2 shows the concept for the amplification control with a PIN diode in a longitudinal branch of the input network and shunt control of the PIN diode current.

The circuit shown in FIG. 2 constitutes a variation of the invention in which the PIN diode 6 is used as a longitudinal control member. In this arrangement, inverse control of the PIN diode 6 is required (high PIN diode current for high amount of amplification). The wiring of the input network to the amplification component 9 is only roughly outlined in FIG. 2.

Figure 3:
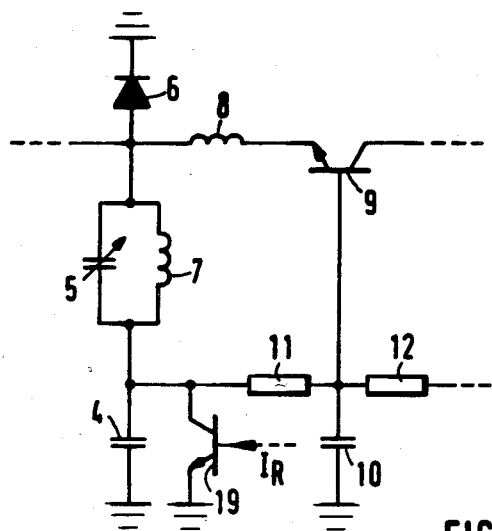
FIG. 3 shows a modification of the concept illustrated in FIG. 1, wherein the operating current of the transistor amplifier stage is used as maximum control current for the PIN diode.
Figure 4:
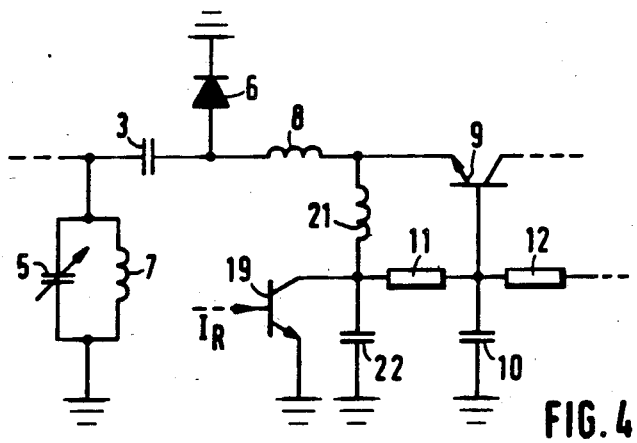
FIG. 4 shows a modification of the concept illustrated in FIG. 3 with a grounded input selective circuit.

In FIG. 3, an embodiment is shown where the maximum controlling current for the PIN diode 6 is also the operating current for the amplifier stage 9. With the shunt transistor 19 blocked, the entire operating current of the transistor stage 9 flows off via the PIN diode 6. The current to diode 6 is constituted by the current from the emitter of transistor 9 and the current which flows through resistor 11 and then through inductor 7. The current through PIN diode 6 decreases as the current through transistor 19 increases. Since the base voltage supply of the transistor 9, with respect to direct current, is determined with reference to the emitter of transistor 9 by a voltage divider composed of resistors 11 and 12, the operating current of the transistor 9 is substantially maintained constant, even when the gain of the input circuit is being varied. When the operating current, i.e. the direct current setting the operating point, of the amplifier transistor 9 is used for controlling diode 6, the entire operating current of the circuit can be kept smaller than in the arrangements shown in FIGS. 1 and 2. Operating currents of other functional stages or other integrated circuits may also be used as a current source for the control member. The non-illustrated part of FIG. 3 is identical to the corresponding part of FIG. 1 except that resistor 17 of FIG. 1 is not present in FIG. 3. FIG. 4 depicts a modification of the circuit shown in FIG. 3, where the frequency selective network 5, 7 may be grounded. This is of advantage whenever a varactor diode is used as the member 5 for tuning the input network.

Figure 5:
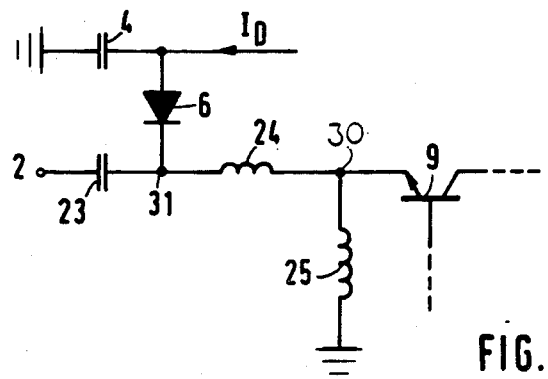
FIG. 5 shows a circuit for amplification control with a PIN diode according to the concept illustrated in FIG. 1, but for non-tunable input networks.

FIG. 5 shows a permanently tuned input circuit with PIN diode control, wherein a series-resonant circuit 23, 24 is connected between signal input 2 and input 30 of the amplifier transistor 9 and wherein the PIN diode 6 acts at the network node 31 which has the highest impedance to ground. The PIN diode 6 is supplied with controlling current in accordance with one of the methods described hereinabove.

Figure 6:
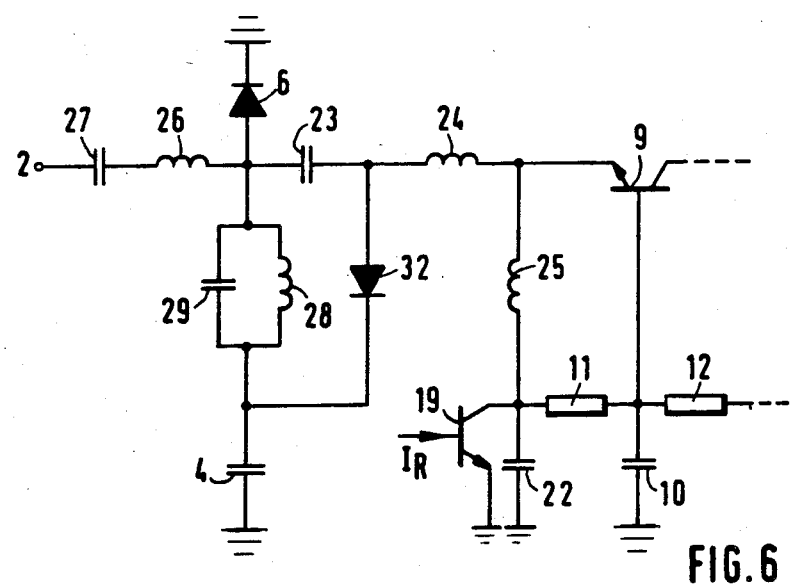
FIG. 6 shows a circuit for amplification control with two PIN diodes and an extended tunable input network.

FIG. 6 illustrates an embodiment of the invention, wherein two PIN diodes 6 and 32 are controlled by means of one of the methods described. In the embodiment shown, current control is provided for the PIN diodes by having the collector-emitter path of transistor 19 connected in series between resistor 11 and ground. The advantage of this circuit is the large range of control obtainable for overall amplification, with the maximum available controlling current being available to both PIN diodes (6, 32). In principle, it is also possible to effect parallel control of the PIN diode by limiting the maximum possible control range.

The invention is also applicable (analogously) if other basic circuits for the amplifier component or other amplifying components such as field-effect transistors or amplifier components of differing conductivity types are employed. The invention may also be used if, instead of an amplifier component of the type listed, a mixer arrangement, passive or active, is provided.

What is claimed is:

1. A signal input circuit having a controllable gain, for conducting an input signal, said circuit comprising: signal input means for receiving the input signal; signal output means for supplying a circuit output signal; an amplifier stage connected between said signal input means and said signal output means for supplying to said signal output means a signal which is a function of the input signal and the gain of said circuit; reactance means connected to said signal input means for receiving the input signal and for tuning said circuit to a selected input signal frequency; a control member connected to receive a controlling current and operatively connected in said circuit for controlling the gain of said circuit as a function of the amplitude of the controlling current; a source of d.c. operating voltage for said circuit; a resistor having a constant resistance connected between said d.c. operating voltage source and said control member for supplying the controlling current to said control member; and a transistor connected to said control member, and having a current conducting path connected in parallel with said control member for controlling the amplitude of the controlling current.

2. A signal input circuit as defined in claim 1 wherein said control member is a PIN diode.

3. A signal input circuit as defined in claim 1 wherein said transistor is a bipolar transistor.

4. A signal input circuit as defined in claim 1 wherein said transistor is a field effect transistor.

5. A signal input circuit as defined in claim 1 wherein said transistor has a collector and a collector-emitter path constituting said current conducting path, and further comprising a diode connected in series between the collector of said transistor and said control member.

6. A signal input circuit having a controllable gain, for conducting an input signal, said circuit comprising: signal input means for receiving the input signal; signal output means for supplying a circuit output signal; an amplifier stage connected between said signal input means and said signal output means for supplying to said signal output means a signal which is a function of the input signal and the gain of said circuit; reactance means connected to said signal input means for receiving the input signal and for tuning said circuit to a selected input signal frequency; a control member connected to receive a controlling current and operatively connected in said circuit for controlling the gain of said circuit as a function of the amplitude of the controlling current; a source of d.c. operating voltage for said circuit; and a transistor connected to said control member for controlling the amplitude of the controlling current, wherein said amplifier stage is connected for amplifying the input signal and is further connected for receiving operating current from said d.c. operating voltage source and for supplying the controlling current to said control member, and further wherein said amplifier stage, said transistor and said control member are connected such that, when said transistor is blocked, all of the operating current supplied to said amplifier stage flows through said control member.

7. A signal input circuit as defined in claim 6 wherein said control member is a PIN diode.

8. A signal input circuit as defined in claim 6 wherein said transistor is a bipolar transistor.

9. A signal circuit as defined in claim 6 wherein said transistor is a field effect transistor.

10. A signal input circuit as defined in claim 6 wherein said transistor has a current conducting path connected in parallel with said control member.

* * * * *